United States Patent
Shioga et al.

(10) Patent No.: US 9,142,476 B2
(45) Date of Patent: Sep. 22, 2015

(54) SEMICONDUCTOR PACKAGE, COOLING MECHANISM AND METHOD FOR MANUFACTURING SEMICONDUCTOR PACKAGE

(71) Applicant: FUJITSU LIMITED, Kawasaki-shi (JP)

(72) Inventors: Takeshi Shioga, Atsugi (JP); Hideaki Nagaoka, Atsugi (JP); Takahiro Kimura, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 334 days.

(21) Appl. No.: 13/854,216

(22) Filed: Apr. 1, 2013

(65) Prior Publication Data

US 2013/0223010 A1  Aug. 29, 2013

Related U.S. Application Data

(63) Continuation of application No. PCT/JP2010/067771, filed on Oct. 8, 2010.

(51) Int. Cl.

| | |
|---|---|
| H01L 23/427 | (2006.01) |
| H05K 7/20 | (2006.01) |
| H05K 1/18 | (2006.01) |
| H01L 23/34 | (2006.01) |
| H01L 23/13 | (2006.01) |
| H01L 23/36 | (2006.01) |
| H01L 21/50 | (2006.01) |
| H05K 1/02 | (2006.01) |
| H01L 25/065 | (2006.01) |

(52) U.S. Cl.
CPC ............... *H01L 23/34* (2013.01); *H01L 21/50* (2013.01); *H01L 23/13* (2013.01); *H01L 23/36* (2013.01); *H01L 23/427* (2013.01); *H05K 1/0203* (2013.01); *H01L 25/0655* (2013.01); *H01L 2224/16225* (2013.01); *H01L 2224/16227* (2013.01); *H01L 2224/73204* (2013.01); *H01L 2924/15311* (2013.01); *H05K 1/0204* (2013.01); *H05K 2201/09072* (2013.01)

(58) Field of Classification Search
CPC ..... H05K 1/203; H05K 1/18; H05K 7/20309; H05K 7/20336; H01L 23/427
See application file for complete search history.

(56) References Cited

U.S. PATENT DOCUMENTS

| 6,611,057 | B2 | 8/2003 | Mikubo et al. | |
| 7,123,479 | B2 * | 10/2006 | Chang et al. | 361/700 |
| 7,128,134 | B2 * | 10/2006 | Shih et al. | 165/104.26 |

(Continued)

FOREIGN PATENT DOCUMENTS

| EP | 0529837 | 3/1993 |
| JP | 5-198713 | 8/1993 |

(Continued)

OTHER PUBLICATIONS

International Search Report, mailed in connection with PCT/JP2010/067771 and mailed Dec. 28, 2010.

(Continued)

*Primary Examiner* — Robert J Hoffberg
(74) *Attorney, Agent, or Firm* — Fujitsu Patent Center

(57) ABSTRACT

A semiconductor package includes a substrate with a first surface on which a semiconductor device is mounted and a second surface opposite to the first surface, and a loop heat pipe including an evaporator and attached to the second surface of the substrate, wherein the substrate has a groove structure in the second surface, the groove structure being in contact with a porous wick provided in the evaporator.

18 Claims, 14 Drawing Sheets

(56) References Cited

U.S. PATENT DOCUMENTS

| | | | |
|---|---|---|---|
| 7,259,965 B2* | 8/2007 | Chang et al. | 361/699 |
| 7,283,360 B2* | 10/2007 | Chang et al. | 361/701 |
| 7,770,630 B2* | 8/2010 | Chesser et al. | 165/65 |
| 7,775,262 B2* | 8/2010 | Liu et al. | 165/104.26 |
| 8,593,810 B2 | 11/2013 | Yoshikawa et al. | |
| 2005/0082158 A1* | 4/2005 | Wenger | 202/155 |
| 2010/0300656 A1* | 12/2010 | Lu et al. | 165/104.26 |
| 2011/0155355 A1* | 6/2011 | Chen | 165/133 |
| 2012/0132402 A1* | 5/2012 | Aoki et al. | 165/104.21 |

FOREIGN PATENT DOCUMENTS

| | | |
|---|---|---|
| JP | 2001-168256 | 6/2001 |
| JP | 2002-151640 | 5/2002 |
| JP | 2002-286384 | 10/2002 |
| JP | 2002-335057 | 11/2002 |
| JP | 2004-047898 | 2/2004 |
| JP | 2007-123547 | 5/2007 |
| JP | 3938017 | 6/2007 |
| JP | 2009-236362 | 10/2009 |
| JP | 2010-107153 | 5/2010 |
| WO | 2010/084717 A1 | 7/2010 |

OTHER PUBLICATIONS

JPOA-Office Action dated Jul. 8, 2014 issued with respect to the corresponding Japanese Application No. 2012-537535, with full English-language translation.

* cited by examiner

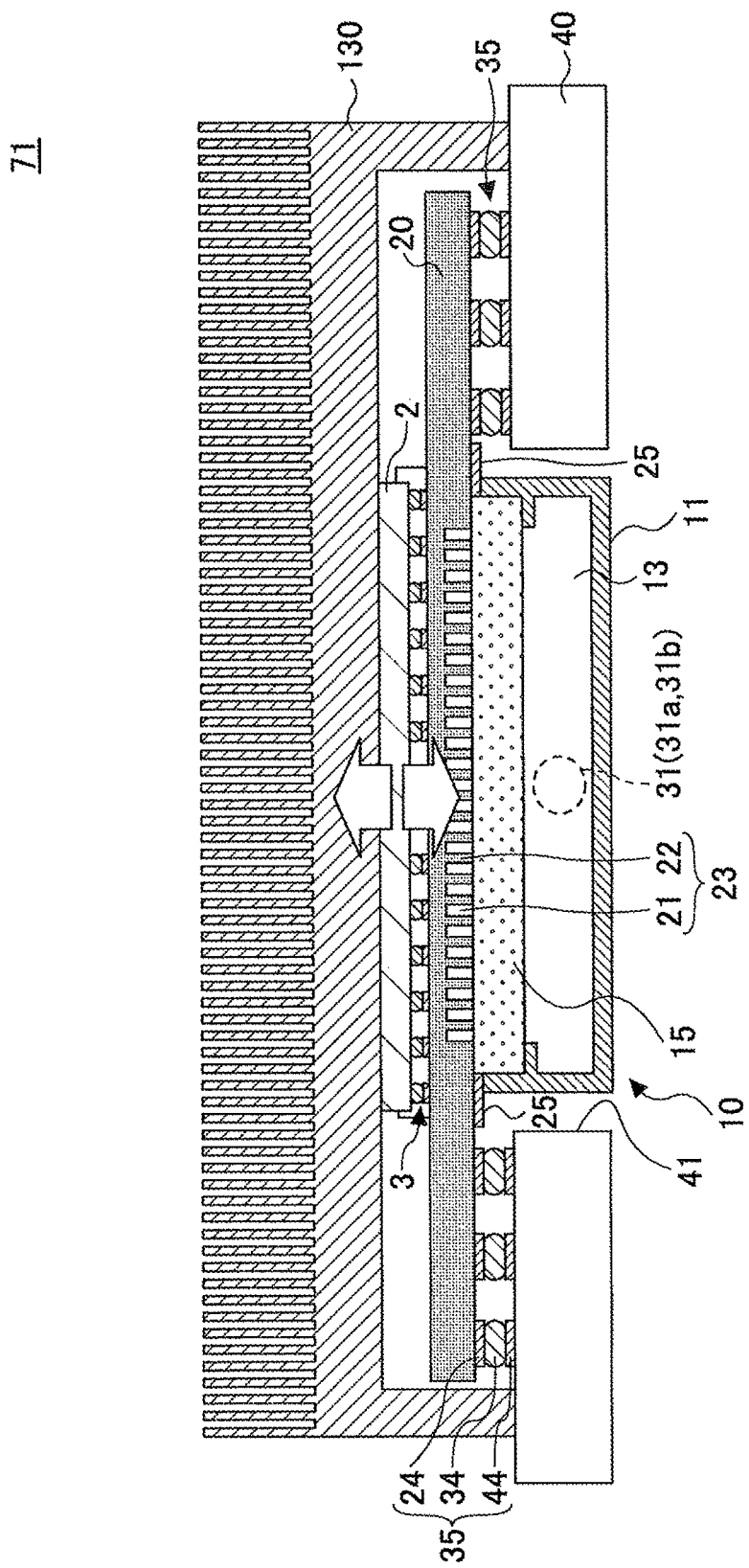

SEMICONDUCTOR PACKAGE, COOLING MECHANISM AND METHOD FOR MANUFACTURING SEMICONDUCTOR PACKAGE

CROSS-REFERENCE TO RELATED APPLICATIONS

This application is a continuation application filed under 35 U.S.C. 111 (a) claiming benefit under 35 U.S.C. 120 and 365(c) of PCT International Application No. PCT/JP2010/067771 filed on Oct. 8, 2010 and designating the United States, the entire contents of which are incorporated herein by references.

FIELD

The present disclosures relate to a semiconductor package, a cooling mechanism, and a method for manufacturing the semiconductor package.

BACKGROUND

In computers and other electronic devices, a configuration illustrated in FIG. 1 is employed to cool a semiconductor device such as a large scale integration (LSI) device. In FIG. 1, rear faces of LSI devices 102a and 102b, which are opposite to connection faces with solder bumps 103 for bonding the LSI devices 102a and 102b to a circuit board 101, are heat dissipating surfaces. The heat dissipating surfaces of the LSI devices 102a and 102b are thermally in contact with a heat spreader or a heat sink 130 to prevent temperature rise of the LSI devices 102a and 102b.

It is predicted that the amount of heat generated from the LSI devices 102a and 102b will increase along with further progress of integration and device performances. It is also expected that the size and the shape of the heat spreader or the heat sink 130 will become larger and more complicated.

It has been proposed to use a metal core substrate in place of an inexpensive resin substrate to efficiently remove heat from the connection side of the LSI device. See, for example, Patent Documents 1-3 listed below. Another known approach is to refine the structure of the heat sink. It has also been proposed to incorporate a heat pipe structure or a microgroove structure in the heat sink to improve the cooling efficiency using a coolant. See, for example, Patent Documents 4-6 listed below.

However, it is worrying that the technique for using a metal core substrate to remove heat as disclosed in Patent Documents 1 and 2 will cause complication and cost increases of the manufacturing process of printed circuit boards. There is also fear that the possibility of equipment design is limited. An interposer using a metal core substrate as disclosed in Patent Document 3 is disadvantageous from the viewpoint of connection reliability and cost because a heat-rejecting interposer is inserted between a board and an LSI chip.

Patent Documents 4 and 5 disclose a structure in which a heat pipe is implemented inside the base of a heat sink provided on the rear face of an LSI chip, opposite to the solder connection side. With this structure, the cooling efficiency is expected to be improved compared with the conventional techniques. However, the temperature distribution in the package board increases when the heat generation of each of the LSI chips increases in a System-in-Package or a 3D-stacked LSI package with heterogeneous integration of multi-chip modules. Accordingly, thermal diffusion or heat dissipation of a heat sink placed on the rear face of the LSI chip is unlikely to be sufficient. In addition, the conventional structure with a heat sink provided on the rear face of the LSI chip requires a thermal interface material between the LSI and the heat sink (having a built-in heat pipe) to guarantee thermal contact to the LSI chip. Since thermal resistance is produced in the thermal interface material, significant improvement in cooling efficiency may not be expected.

Patent Document 6 discloses a technology for forming a micro channel inside the heat sink provided on the rear face of the LSI chip to circulate a coolant to cool the LSI chip. The manufacturing and assembling of this cooling system are complicated and there is a problem in reliability due to leakage of coolant.

There is a demand for a cooling mechanism and structure and a manufacturing method of a semiconductor package that can efficiently remove heat from a heat source such as a semiconductor device without making a significant change to the specifications of a conventional heat rejecting system such as a heat spreader or a heat sink.

LIST OF PRIOR ART DOCUMENTS

PATENT DOCUMENT 1: Japanese Laid-open Patent Publication No. 2004-47898
PATENT DOCUMENT 2: Japanese Laid-open Patent Publication No. 2002-335057
PATENT DOCUMENT 3: Japanese Patent No. 3938017
PATENT DOCUMENT 4: Japanese Laid-open Patent Publication No. 2007-123547
PATENT DOCUMENT 5: Japanese Laid-open Patent Publication H05-198713
PATENT DOCUMENT 6: Japanese Laid-open Patent Publication No. 2002-151640

SUMMARY

In one aspect of the disclosure, a semiconductor package includes:
a substrate with a first surface on which a semiconductor device is mounted and a second surface opposite to the first surface; and
a loop heat pipe including an evaporator and attached to the second surface of the substrate,
wherein the substrate has a groove structure in the second surface, the groove structure being in contact with a porous wick provided in the evaporator.

In another aspect of the disclosure, a method for manufacturing a semiconductor package is provided. The method includes:
providing a groove structure to a surface opposite to a device mounting surface of a substrate on which a semiconductor device is mounted; and
attaching an evaporator of a loop heat pipe to the substrate such that a porous wick provided in the evaporator is in contact with the groove structure.

The object and advantages of the invention will be realized and attained by means of the elements and combinations particularly pointed out in the claims.

It is to be understood that both the foregoing general description and the following detailed description are exemplary and explanatory and are not restrictive to the invention as claimed.

BRIEF DESCRIPTION OF DRAWINGS

FIG. 7 is a schematic cross-sectional view of an application of the semiconductor package in FIG. 2;

DESCRIPTION OF EMBODIMENTS

Figure 1:
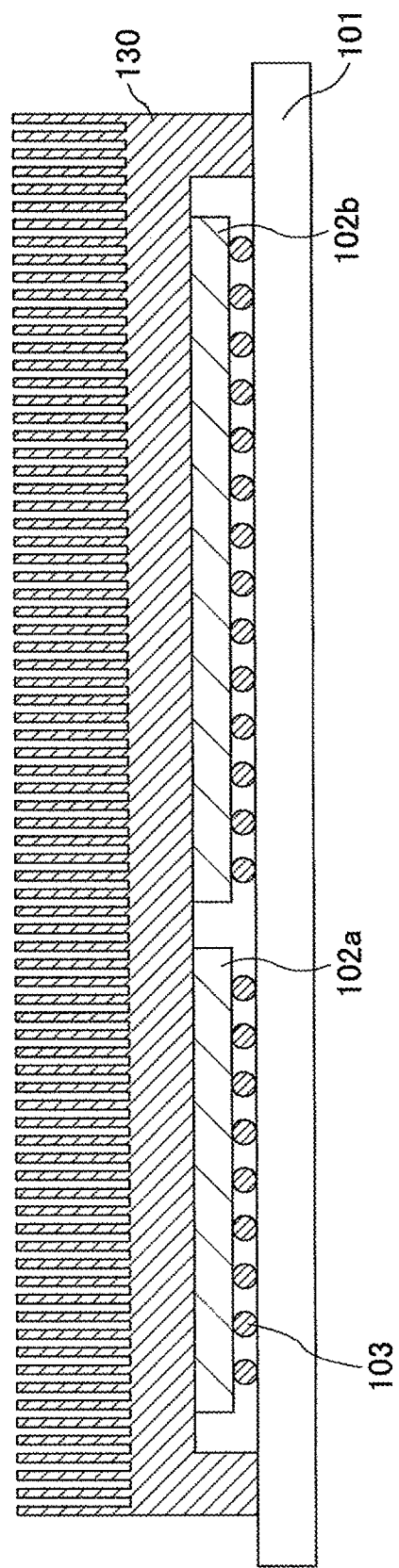
FIG. 1 is a schematic diagram illustrating a cross-sectional view of a conventional cooling mechanism for an LSI device.

The embodiments of the invention are described below in more detail with reference to the drawings. In the drawings, the same components are denoted by the same numerical symbols, and redundant explanation for them is omitted. The embodiments provide tangible examples of a cooling mechanism for cooling a heat source such as an LSI device, a semiconductor package in which a cooling mechanism is assembled, and a semiconductor package manufacturing method. A heat source such as an LSI device or an arbitrary electronic component is mounted on a substrate. A groove structure is provided to a surface opposite to the device mounted surface of the substrate. The groove structure is formed selectively in accordance with the amount of heat generated from the heat source. A partition wall (or a ridge) separating adjacent grooves is in contact with a porous wick provided in an evaporator to transfer the heat from the bonding face of the heat source to the porous wick. A working fluid or a coolant flowing into the evaporator permeates the porous wick. The heat transferred to the porous wick causes the working fluid to evaporate at the surface of the porous wick. The latent heat of vaporization removes heat from the heat source. The grooves of the groove structure serve as vapor discharge channels of the evaporator.

The groove structure provided in the substrate (or the mounting board) on which a heat source such as an LSI device is mounted is incorporated in the evaporator of the loop heat pipe. Heat from the heat source is removed directly from the bonding plane between the heat source and the mounting board without a thermal interface material. In the following, more specific examples are explained.

[Embodiment 1]

Figure 2:
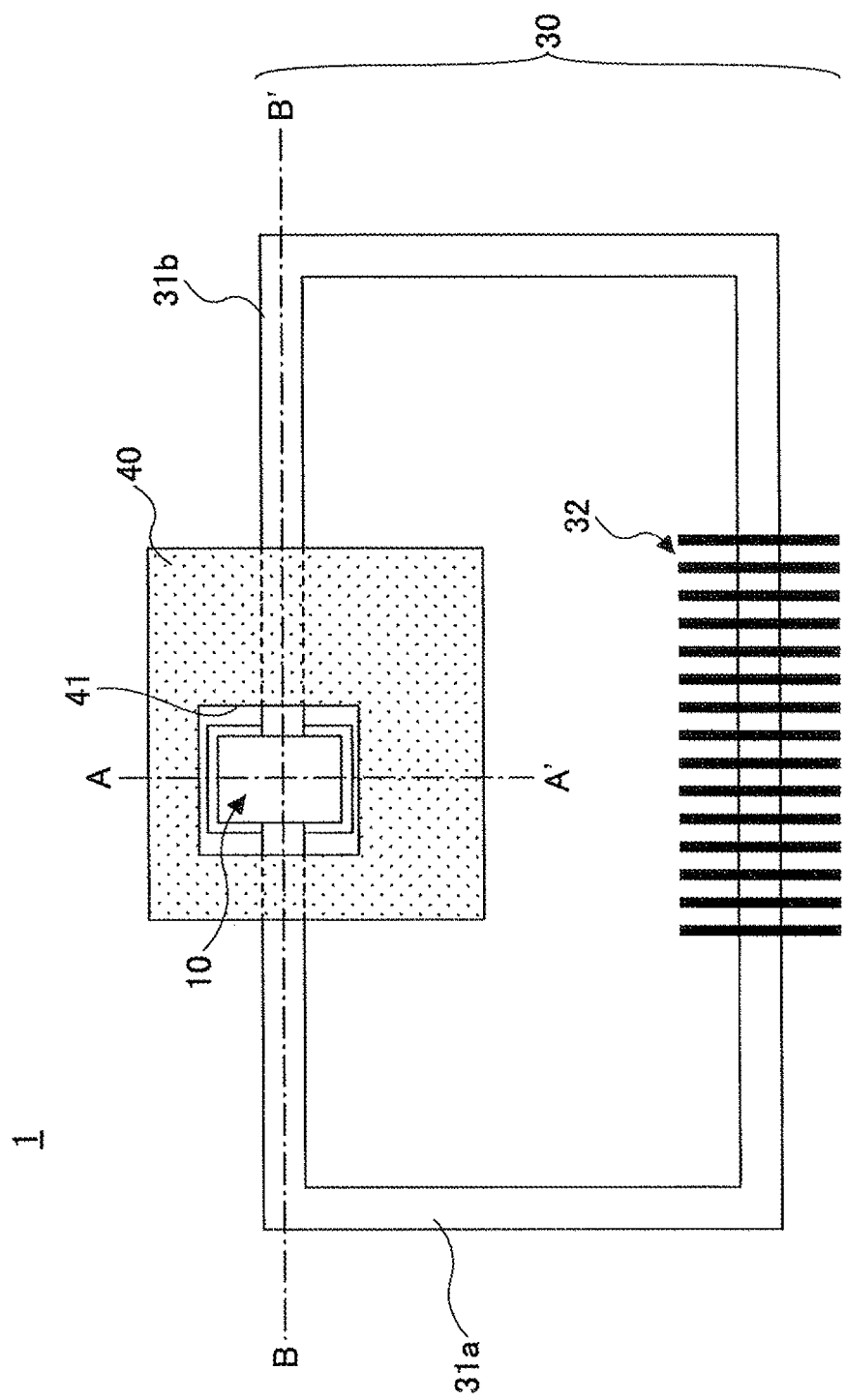
FIG. 2 is a schematic diagram illustrating a top view of a semiconductor package in which a loop heat pipe is assembled according to the first embodiment.

FIG. 2 is a schematic top view of a semiconductor package 1 according to the Embodiment 1. In Embodiment 1, an LSI device, which is an example of the heat source, is mounted on an interposer substrate used as an example of the heat source mounting board. In FIG. 2, the interposer substrate and the LSI device (see FIG. 3 and FIG. 4) are omitted for the sake of convenience of illustration, and a positional relationship between a loop heat pipe 30 and a printed circuit board 40 is mainly depicted.

In the semiconductor package 1, an opening 41 is formed in the printed circuit board 40 at a position at which an LSI device (not illustrated in this figure) is to be mounted. An evaporator 10 of a loop heat pipe 30 is placed in the opening 41 of the printed circuit board 40. The evaporator 10, a liquid line 31a for supplying liquid phase working fluid to the evaporator 10, and a vapor line 31b for guiding vapor phase working fluid from the evaporator 10 to a radiator 32 are connected in a loop to form a fluid (coolant) circulating channel. This looped structure constitutes a loop heat pipe 30. The liquid line 31a and the vapor line 31b connected to the evaporator 10 are arranged on a backside of the printed circuit board 40.

Figure 3:
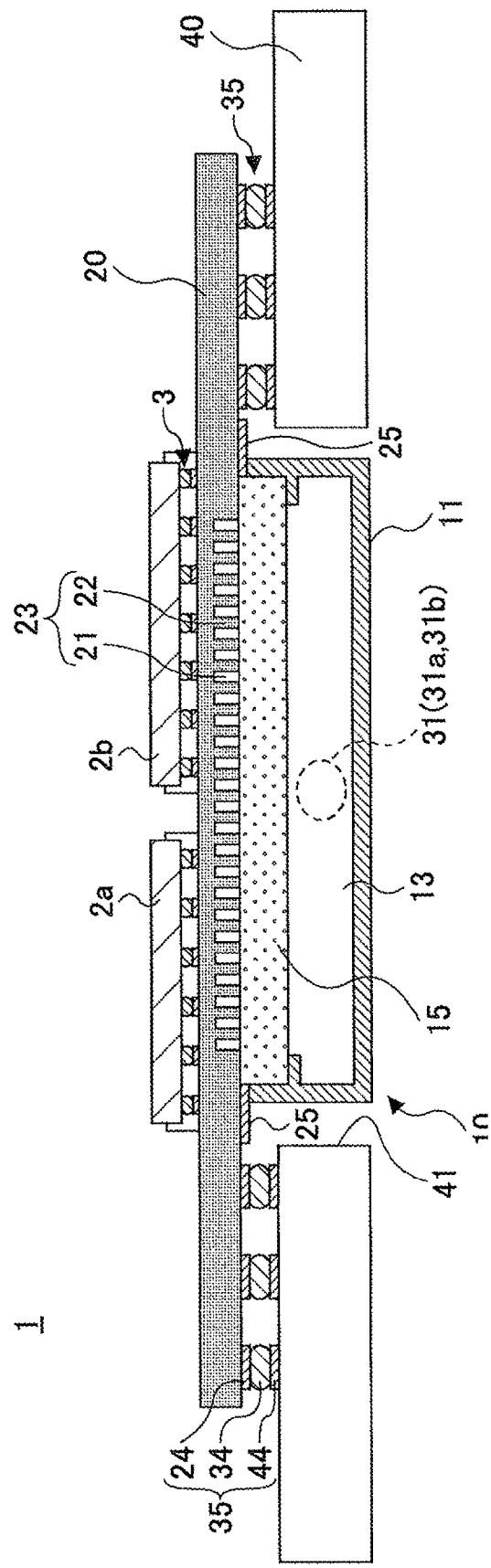
FIG. 3 is a cross-sectional view taken along the A-A' line of the semiconductor package in FIG. 2.
Figure 4:
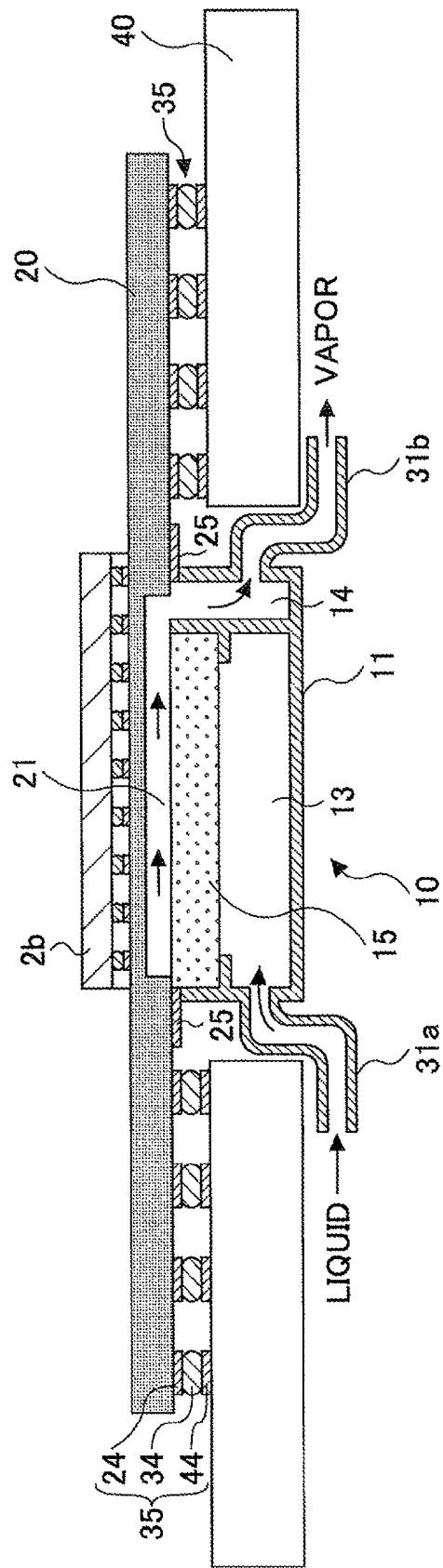
FIG. 4 is a cross-sectional view taken along the B-B' line of the semiconductor package in FIG. 2.

FIG. 3 is a cross-sectional view taken along the line A-A' of FIG. 2, and FIG. 4 is a cross-sectional view taken along the line B-B' of FIG. 2, which figures depict an interposer substrate 20 and LSI devices 2a and 2b. In FIG. 3, two or more LSI devices 2a and 2b are mounted on the interposer substrate 20 via connecting terminals 3 such as solder bumps or the like. The interposer substrate 20 converts a wiring pitch of the LSI devices 2a and 2b to allow the LSI devices 2a and 2b to be electrically connected to the printed circuit board 40. A bonding part 35 between the interposer substrate 20 and the printed circuit board 40 may include, for example, an electrode pad 24 formed on the interposer substrate 20, and an electrode pad 44 and a protruding electrode 34 formed on the printed circuit board 40.

The printed circuit board 40 has an opening 41 formed at a position corresponding to the LSI mounting position of the interposer substrate 20, and the evaporator 10 is placed in the opening 41. The evaporator 10 includes an evaporator case 11 formed of a metal or another suitable material. A fluid chamber 13 is formed inside the evaporator case 11, and liquid phase working fluid flows into the fluid chamber 13 from the liquid line 31a. A porous wick 15 is provided above the fluid chamber 13 in the evaporator case 11. The porous wick 15 may be a sintered metal, a ceramics, or an organic resin, having uniform micro-pores with a pore size of 1-20 µm. Due to the capillary force generated in the micro-pores of the porous wick 15, the liquid phase working fluid in the fluid chamber 13 moves to the surface of the porous wick 15 adjacent to the interposer substrate 20.

A groove structure 23 is provided in a surface opposite to the device mounting surface of the interposer substrate 20 on which the LSI devices 2a and 2b are mounted. The grooved surface of the interposer substrate 20 faces the porous wick 15. In Embodiment 1, as described later, the groove structure 23 is formed directly in the interposer substrate 20. The groove structure 23 includes two or more grooves 21 and a partition wall (ridge) 22 separating adjacent grooves. The top of the partition wall (ridge) 22 is in contact with, or desirably, in tight contact with the porous wick 15.

The heat emitted from the LSI devices 2a and 2b is transferred to the interposer substrate 20 through the connection part 3 and further to the porous wick 15 through the partition wall 22 of the groove structure 23. Since the partition wall 22 is in contact with the porous wick 15, the heat transferred to the partition wall 22 vaporizes the coolant (working fluid) at the surface of the porous wick 15. The vapor phase working fluid flows out of the evaporator 10 through the grooves 21. The grooves 21 formed in the interposer substrate 20 serve as a channel for guiding the vapor phase working fluid to the vapor line 31b.

In order to allow the groove structure 23 of the interposer substrate 20 to serve as the vapor flow channel, as well as the heat transfer means to absorb heat from the heat source, the evaporator case 11 is held in tight contact against the interposer substrate 20. In the example illustrated in FIG. 3, a metal frame 25 for sealing the evaporator 10 is provided on the surface of the interposer substrate 20 in which the grooves 21 are formed. The metal frame 25 is formed simultaneously with the electrode pads 24 of the bonding parts 35. The evaporator 10 is assembled into the semiconductor package 1 by soldering the top end of the periphery of the evaporator case 11 to the metal frame 25. This arrangement can absorb heat generated from the LSI device 2a and 2b through the connection part 3.

FIG. 4 is a cross-sectional view of the semiconductor package 1 taken along the line B-B', parallel to a flow direction of the working fluid. The working fluid condensed at the radiator 32 (see FIG. 2) is supplied to the fluid chamber 13 from the liquid line 31a into the evaporator 10. As described above, the liquid phase working fluid permeates the porous wick 15 under the capillary force and evaporates at the surface of the porous wick 15 adjacent to the interposer substrate 20. The vapor phase working liquid flows into an outlet chamber 14 through the channels 21 formed in the interposer substrate 20 and flows out of the evaporator 10 into the vapor line 31b. The vapor phase working fluid is guided from the vapor line 31b to the radiator 32, at which the vapor is condensed and liquefied.

By repeating the process, the heat generated at the LSI devices 2a and 2b is transferred to the radiator 32, and the temperature rise of the LSI devices is prevented. The porous wick 15 serves as a check valve to prevent backflow of the fluid making use of the capillary force. At the same time, it serves as a pump in the viewpoint of vaporizing the incoming liquid phase working fluid and discharging the vapor. The working fluid is circulated in the fluid circulating channel formed by the liquid line 31a and the vapor line 31b. The groove structure 23 provided to the interposer substrate 20 becomes a part of the fluid circulating channel of the loop heat pipe 30 and removes heat generated from the LSI devices 2 mounted on the interposer substrate 20 in an efficient manner. In the configuration of FIG. 4, the liquid line 31a and the vapor line 31b are arranged along the bottom face (opposite to the mounting surface for receiving the interposer substrate 20) of the printed circuit board 40.

Figure 5:
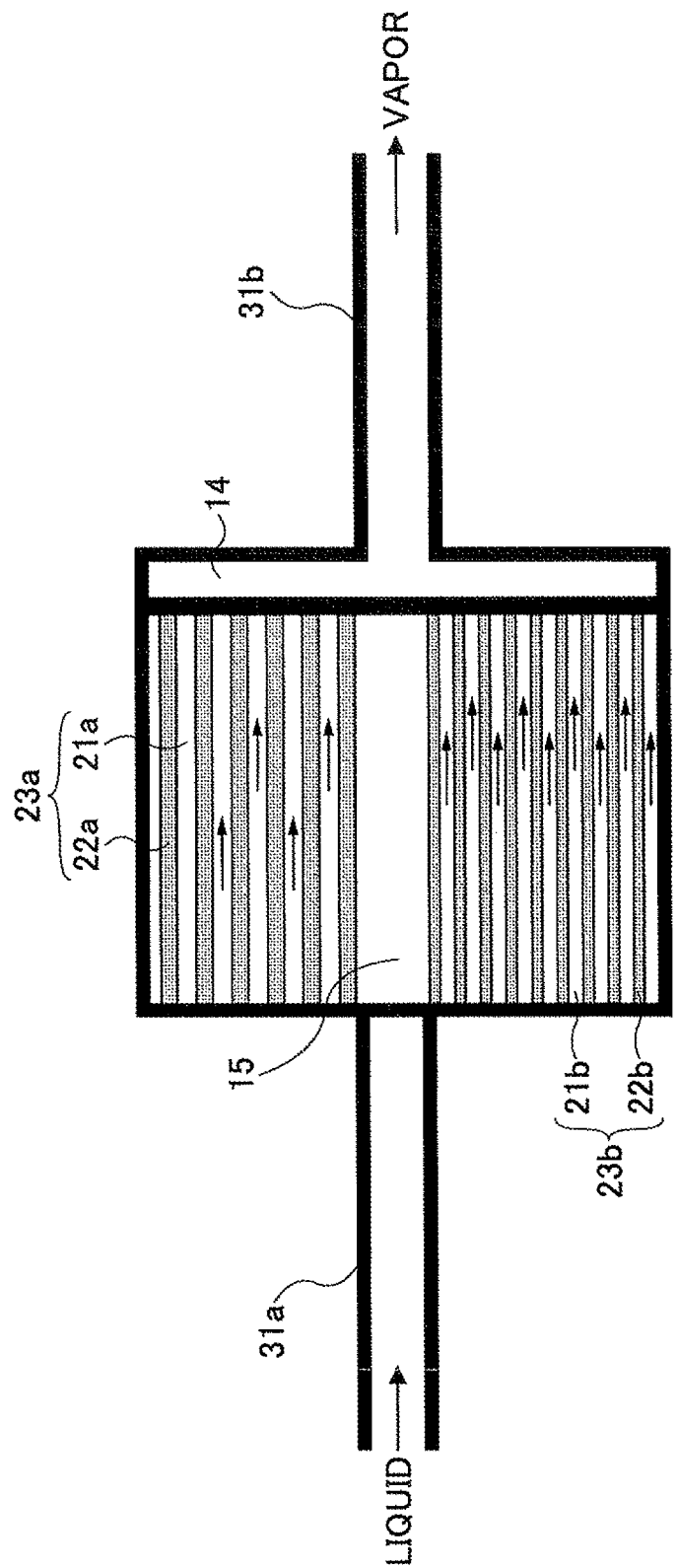
FIG. 5 is a horizontal cross-sectional view illustrating a configuration example of an evaporator of a loop heat pipe used in the semiconductor package in FIG. 2.

FIG. 5 is a horizontal cross-sectional view of the groove structure 23 of the semiconductor package 1 in which two LSI devices (for example, the LSI devices 2a and 2b in FIG. 3) are mounted. Two different types of groove structures 23a and 23b are employed in this example. The groove structures 23a and 23b may be collectively referred to as a "groove structure 23".

The shape and the layout of the groove structure 23 are selected appropriately depending on the amount of heat generation of the LSI devices. The groove structure 23 formed in the interposer substrate 20 takes a role of transferring heat from the heat source (the LSI devices 2a and 2b) to the porous wick 15, and discharging the vapor produced at the surface of the porous wick 15. In particular, the partition walls 22 transfer heat and the grooves 21 serve as outlet pathways to discharge the vapor. For a multi-chip package implementing a plurality of different types of LSI devices, the amount of heat generated from the respective LSI devices varies, and consequently, the amount of vaporization and the vapor pressure at the surface of the porous wick 15 vary. Therefore, if the semiconductor package 1 is designed as a multi-package, the overall design including width and spacing (i.e., a thickness of the partition walls) of the groove structure 23 is determined in accordance with the amount of heat generation from the LSI devices 2a and 2b. This arrangement is advantageous from the view point of realizing effective heat rejection by regulating the amount of vaporization and the vapor flow rate.

In the example of FIG. 5, for the groove structure 23a formed at a position corresponding to the LSI device 2a with a large amount of heat generation, the width of the grooves 21a and the groove pitch (or the thickness of the partition wall 22a) are set greater that those of the groove structure 23b. By increasing the thickness of the partition wall 22a, the heat transfer area becomes large and concentration of the heat transferred from the LSI device 2a is prevented. If the amount of heat generation of the LSI device 2a is large, the quantity of vapor produced at the surface of the porous wick 15 increases and the vapor pressure rises. By broadening the groove 21a, the vapor pressure is reduced to a level equivalent to the vapor pressure in the groove 21b formed in the other area.

For the groove structure 23b corresponding to the LSI device 2b with a lesser amount of heat generation, the width of the groove 21b is less than that of the groove 21a, and the thickness of the partition wall 22b is smaller than that of the partition wall 22a. The number of the grooves 21b and the number of the partition walls 22b are increased. This arrangement increases the heat transfer density and the vapor pressure to rapidly discharge the vapor even if the amount of heat generation is small. The arrangement illustrated in FIG. 5 can make the heat rejection rate of the entire groove structure uniform and increase the cooling efficiency. The vapor flowing through the groove structures 23a and 23b into the outlet chamber 14 is guided into the vapor line 31b.

Figure 6A:
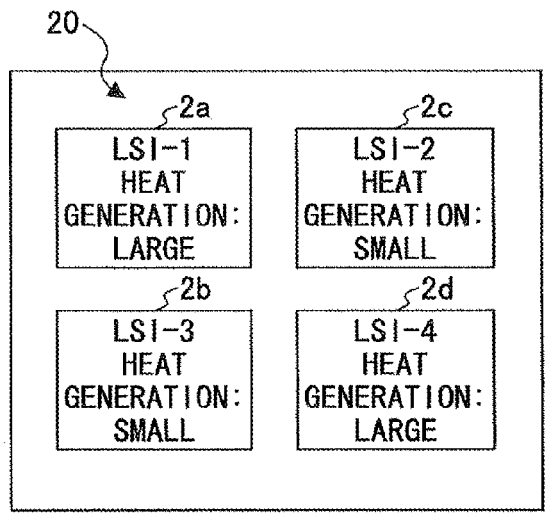
FIG. 6A illustrates a layout of LSI devices to be cooled in the semiconductor package (multi-chip package) in FIG. 2.
Figure 6B:
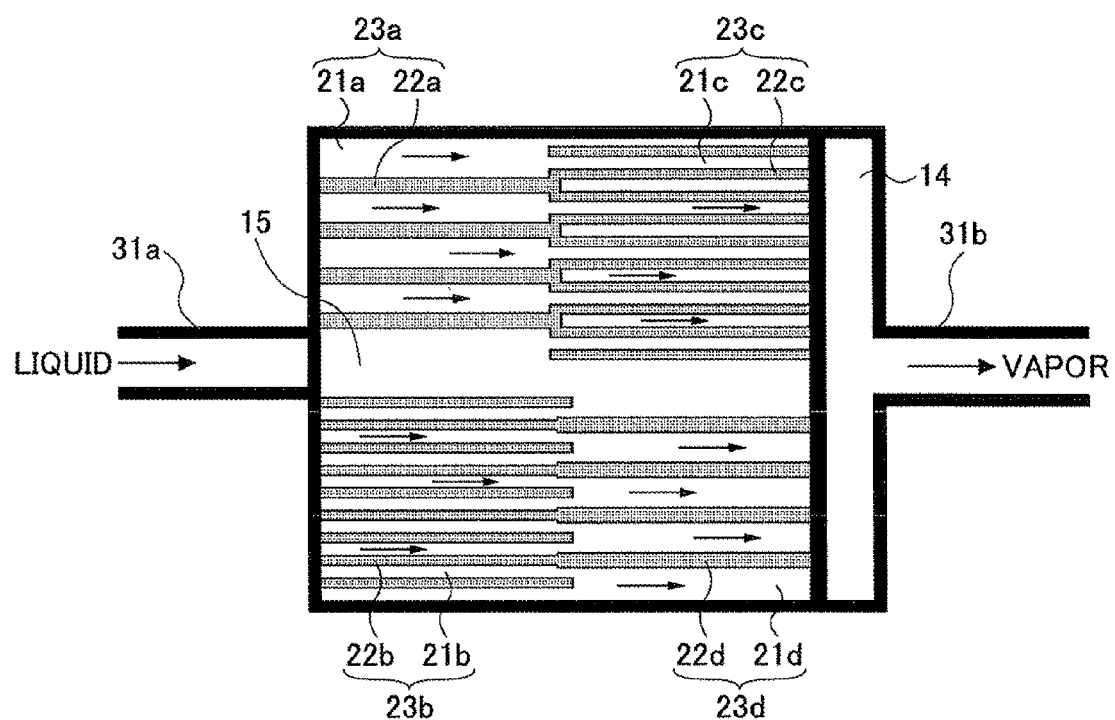
FIG. 6B is a horizontal cross-sectional view illustrating a configuration example of an evaporator of a loop heat pipe designed corresponding to the layout of FIG. 6A.

FIG. 6A illustrates another example of the multi-chip package in which four LSI devices 2a, 2b, 2c and 2d with different amounts of heat generation are mounted. FIG. 6B illustrates an example of a groove structure 23 that corresponds to the layout of FIG. 6A. In FIG. 6A, the amount of heat generation at LSI-3 (LSI device 2b) positioned near the liquid line 31a is small. Accordingly, the amount of vaporization and the vapor pressure at the surface of the porous wick 15 are small. On the other hand, the amount of heat generation at LSI-4 (LSI device 2d) positioned near the vapor line 31b is large. Accordingly, the amount of vaporization and the vapor pressure at the surface of the porous wick 15 are greater than those of LSI-3. If the same groove structure 23 is employed regardless of the amount of heat generation at LSI devices 2a through 2d, the vapor produced at LSI-3 (LSI device 2b) maybe blocked by the vapor pressure of LSI-4 (LSI device 2d) and may not reach the vapor line 31b. In that case, heat generated from LSI-3 cannot be removed. The LSI-3 will become very hot and it may break down in the worst case. To avoid this situation, the groove structure 23 is designed selectively in accordance with the amount of heat generation of the respective LSI devices 2a through 2d, as illustrated in FIG. 6B. The semiconductor devices are cooled uniformly and efficiently in the multi-chip package even if multiple devices (heat sources) are arranged along the flow direction of the working fluid.

Adjusting the groove structure in accordance with the amount of heat generated from individual devices is advantageous not only for heterogeneous integration of LSI devices, but also for resolving a localized high heat flux area (a hot spot) inside the LSI device. For example, with the groove structure 23b of FIG. 6B, the vapor pressure at the hot spot can be reduced to the same level as that of the other portions by locally increasing the width of the groove 21b and the thickness of the partition walls 22b. The groove structure 23 can be fabricated easily in the etching process of the interposer substrate, or using a separate electroforming process or other machining processes, as described later. The groove structure 23 is formed into a desired shape. Accordingly, localized blocking of vapor flow is prevented in the groove structure 23, and uniform and efficient cooling operations are carried out as a whole using the groove structure 23.

[Modification 1]

FIG. 7 illustrates Modification 1 of the semiconductor package 1 illustrated in FIG. 2 through FIG. 4. A semiconductor package 71 of FIG. 7 has a heat sink 130, in addition to the built-in loop heat pipe 30. In this configuration, heat is removed from the connection part 3 of the LSI device 2 and the backside of the LSI device 2 opposite to the connection 3, as indicated by the white arrows in the figure.

Assuming that the heat generation of the LSI device 2 is 100 W, approximately 95 W of heat can be absorbed at the heat sink 130, while about 5 W of heat is generally transferred to the substrate in the conventional cooling system illustrated in FIG. 1. If the amount of heat generated from the LSI device 2 increases by 20%, the loop heat pipe 30 will absorb 25 W of heat in the semiconductor package 71 of FIG. 7 because 95 W of heat is absorbed at the conventional heat sink 130. If the cooling ability (heat absorbing ability) of the loop heat pipe 30 is 70 W, additional 45 W (70 W minus 25 W) of heat can be absorbed at the loop heat pipe 30. This means that the heat absorption at the heat sink 130 is reduced to 50 W (90 W minus 45 W), which is almost a half of the conventional level. It is known that in general the heat rejection rate at the heat sink 130 is in proportion to square root (the ½ power) of the wind speed. The airflow rate supplied to the heat sink 130 can be reduced to ¼ in this case. Consequently, power consumption at a fan mechanism for accelerating the heat rejection from the heat sink 130 is reduced.

Figure 8A:
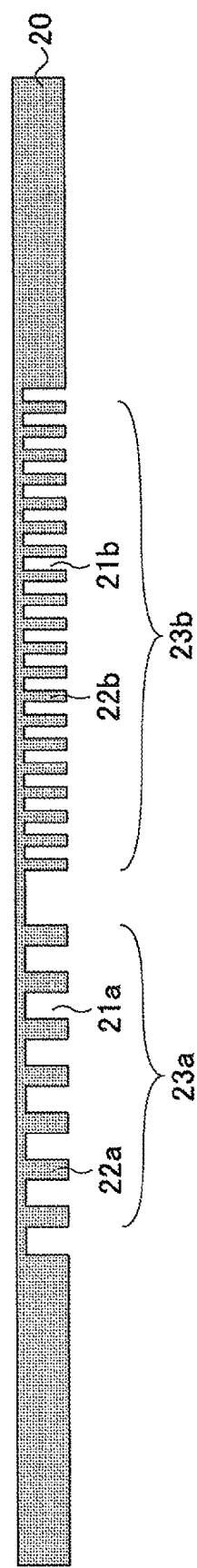
FIG. 8A illustrates a manufacturing process for a semiconductor package according to an embodiment of the present invention.

FIG. 8A through FIG. 8E illustrates a manufacturing process of the semiconductor package 1 of Embodiment 1. First, as illustrated in FIG. 8A, the groove structure 23 is formed at a position corresponding to the LSI mounting area of the interposer substrate 20. In this case, groove structures 23a and 23b with different layouts and different shapes are formed for a multi-chip package. The groove structures 23a and 23b may be referred to collectively as "groove structures 23."

The interposer substrate 20 is, for example, a silicon substrate with a thickness of 500 μm. Grooves 2a and 2b of 350-micron depth are formed by photo lithography and dry etching. The pitch or the spacing of the groove can be selected arbitrarily from the range between 30 μm to 500 μm according to the layout and the amount of heat generated from the LSI devices mounted on the substrate. For example, a groove structure 23a with grooves 21a of 200 μm width and partition walls 22a of 100 μm thickness is formed in the area corresponding to the LSI device 2a. Another groove structure 23b with grooves 21b of 100 μm width and partition walls 22b of 50 μm thickness is formed in the area corresponding to the LSI device 2b. Because the grooves 21a and 21b are formed directly in the interposer substrate 20 by dry etching, arbitrary shapes of grooves can be formed at once.

Figure 8B:
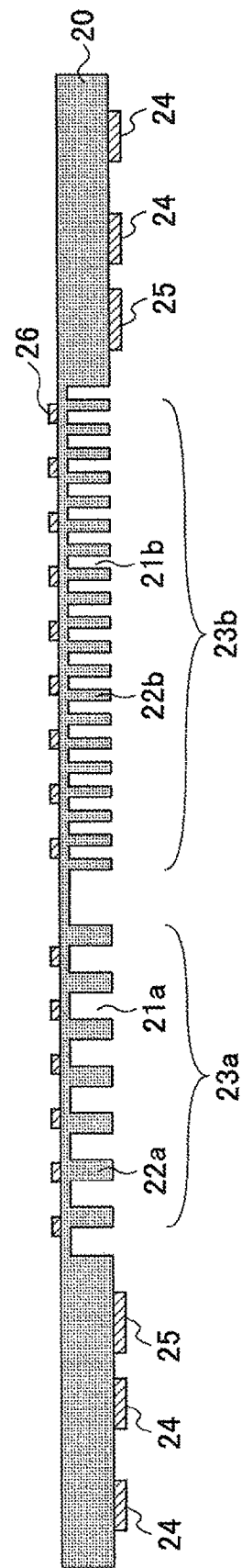
FIG. 8B illustrates a manufacturing process for the semiconductor package according to the embodiment of the present invention.

Then, as illustrated in FIG. 8B, through-silicon via plugs and multi-layer wirings (not illustrated) are formed in the interposer substrate 20. Then, pad electrodes 26 are formed on the first surface on which LSI devices are to be mounted, while pad electrodes 26 and a metal frame 25 for sealing the evaporator are formed on the second surface which is to be connected to a printed circuit board 40. The pad electrodes 26 and 24 and the metal frame 25 can be formed by an arbitrary method such as plating, screen printing, or vapor deposition.

Figure 8C:
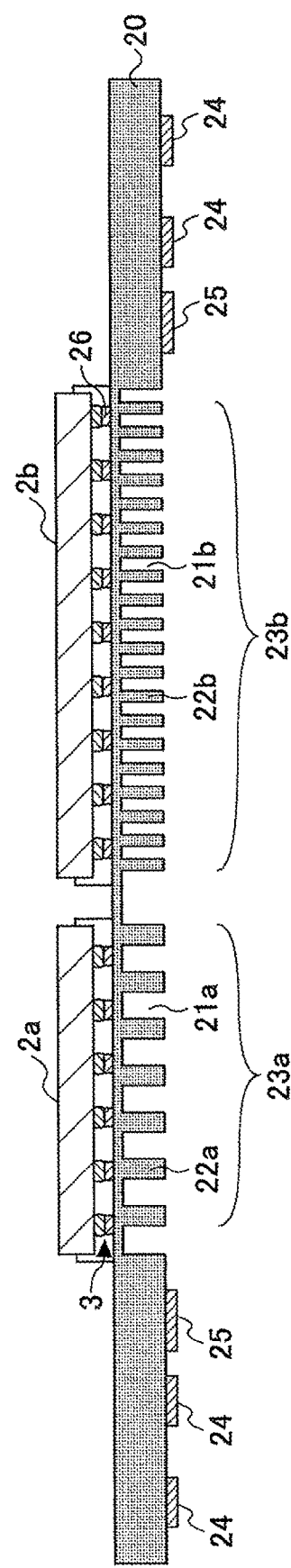
FIG. 8C illustrates a manufacturing process for the semiconductor package according to the embodiment of the present invention.

Then, as illustrated in FIG. 8C, LSI devices 2a and 2b are flip-chip bonded on the pad electrodes 26 of the interposer substrate 20 by a chip bonder or the like. In this example, the LSI device 2a with higher heat generation is mounted at a position corresponding to the groove structure 23a, and the LSI device 2b with less heat generation is mounted at a position corresponding to the groove structure 23b.

Figure 8D:
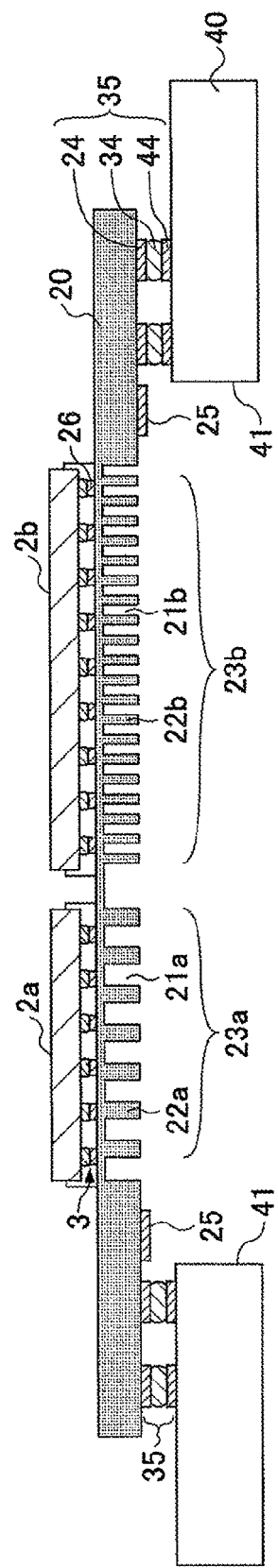
FIG. 8D illustrates a manufacturing process for the semiconductor package according to the embodiment of the present invention.

Then, as illustrated in FIG. 8D, the interposer substrate 20 with the LSI devices 2a and 2b mounted is soldered to the pad electrodes 44 and protruding electrodes 34 of the printed circuit board 40. An opening 41 is formed in the printed circuit board 40 in advance. The groove structures (including the groove structures 23a and 23b) of the interposer substrate 20 face the opening 41 of the printed circuit board 40.

Figure 8E:
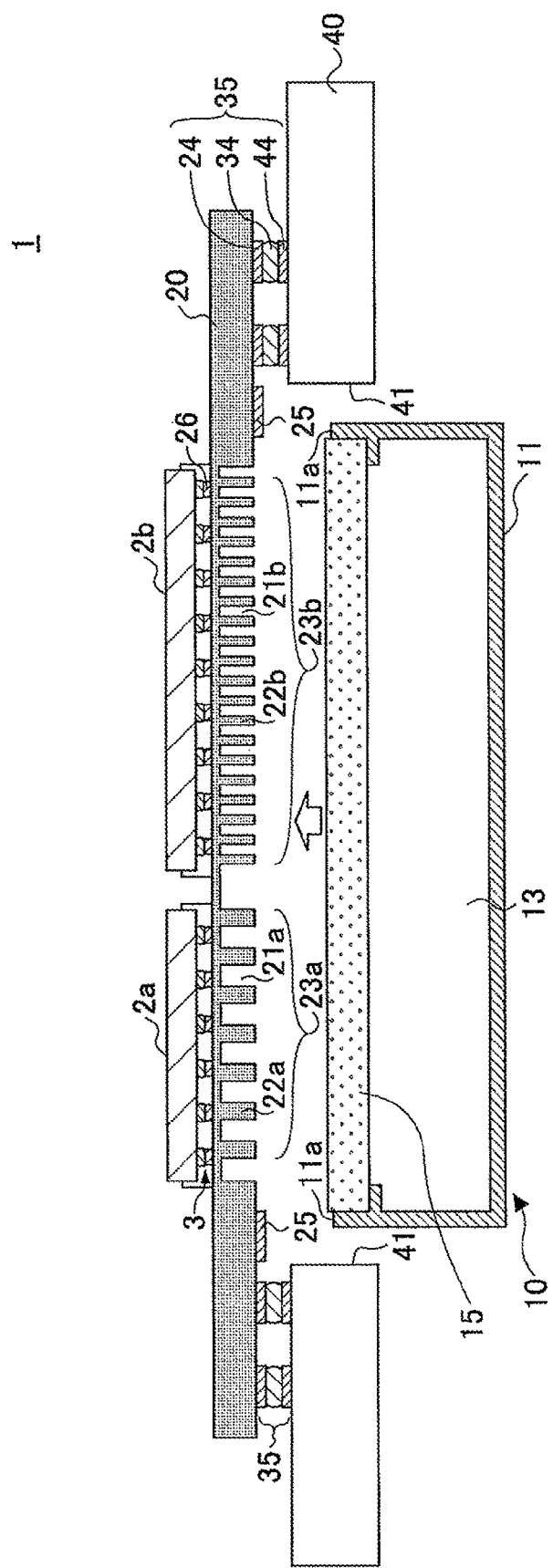
FIG. 8E illustrates a manufacturing process for the semiconductor package according to the embodiment of the present invention.

Then, as illustrated in FIG. 8E, the porous wick 15 provided in the evaporator case 11 is pressed against the partition walls 22a and 22b of the groove structures 23a and 23b, and the top end 11a of the evaporator case 11 is soldered to the metal frame 25 of the interposer substrate 20 to seal the evaporator 10, indicated by the white arrow. The porous wick 15 is, for example, a nickel sintered metal with average pore size of 10 μm and porosity of 45%. Although not illustrated in figure, a liquid line 31a, a vapor line 31b and a radiator 32 are to be connected to the evaporator 10 as illustrated in FIG. 2. Preferably, the soldering process for sealing the evaporator is performed at a low temperature to avoid adverse influence on the connection parts 3 of the LSI devices 2a and 2b or the bonding parts 35 between the interposer substrate 20 and the printed circuit board 40. For example, a soldering paste made of materials including Indium or Bismuth is used to seal the evaporator case 11. After the evaporator 10 is attached to the interposer substrate 20, the liquid line and the vapor line are connected to the evaporator 10, and working fluid is inlet in the evaporator 10. The working fluid is, for example, water, alcohol such as ethanol, or Hydrochlorofluorocarbon (HCFC). In Embodiment 1, hydrofluorocarbon HFC-365mfc (whose boiling point is about 40° C.) is inlet, and the semiconductor package 1 with a built-in loop heat pipe is completed.

Then, as illustrated in FIG. 8D, the the semiconductor package is only an example, and there are many modifications and alterations. For example, the steps illustrated in FIG. 8A and FIG. 8B may be switched. In this case, through-silicon via plugs and multi-layer wirings (not illustrated) are formed in the interposer substrate 20, and successively the pad electrodes 26 and 24 as well as the metal frame 25 are formed. Then, the groove structure 23 may be formed in the interposer substrate 20.

[Modification 2]

Figure 9A:
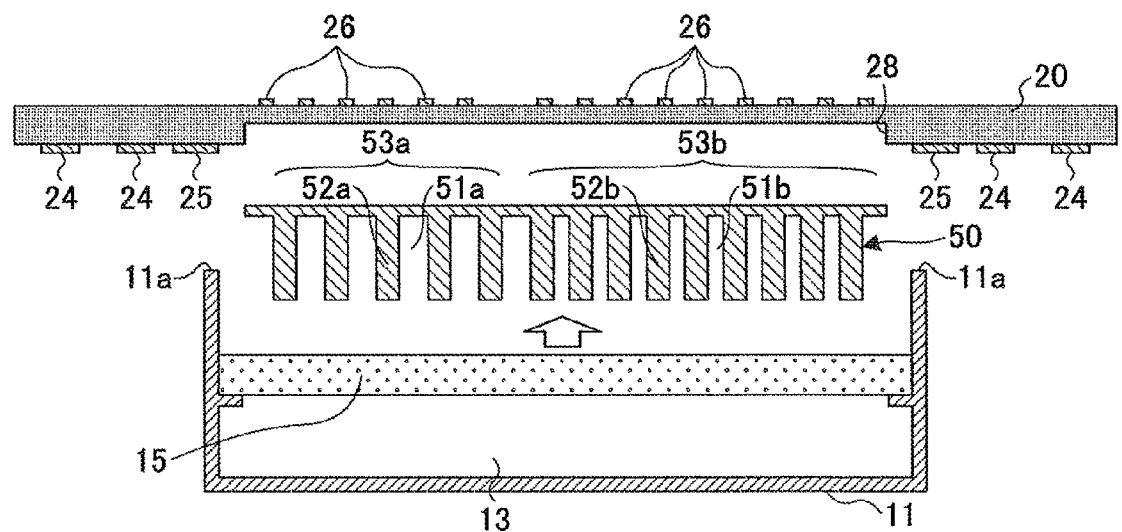
FIG. 9A illustrating a manufacturing process for a semiconductor package according to another embodiment of the present invention.
Figure 9B:
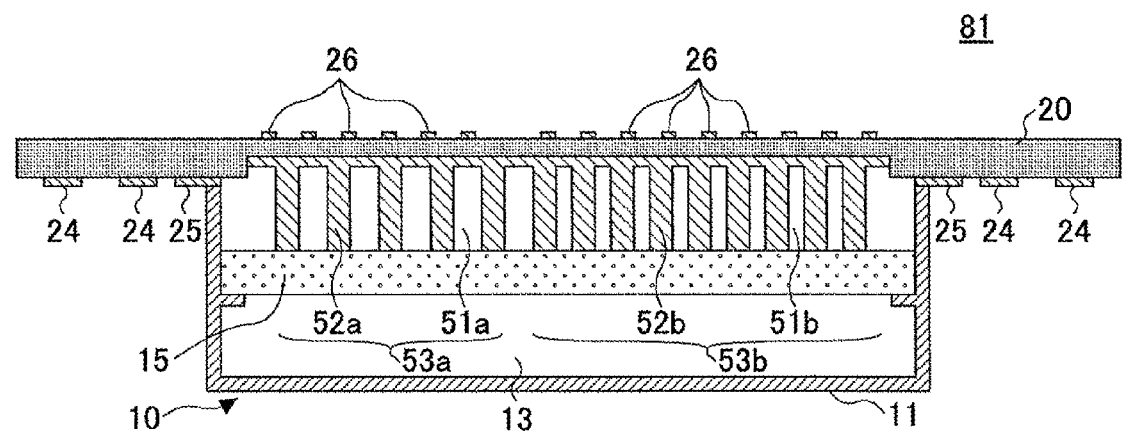
FIG. 9B is a schematic cross-sectional view of the semiconductor package assembled by the manufacturing process of FIG. 9A.

FIG. 9A and FIG. 9B illustrate Modification 2 of the semiconductor package illustrated in FIG. 2 through FIG. 4. In Modification 2, in place of forming the groove structure directly in the interposer substrate 20, the groove structure is mounted on the interposer substrate 20, that is, a groove structure 50 formed separately is used. The groove structure 50 is fixed to the opposite side of the LSI mounting surface of the interposer substrate 20. Optionally, a recess 28 may be formed in the interposer substrate 20 to receive the groove structure 50. The recess 28 may be formed using an ordinary photo lithography technique and dry etching. Pad electrodes 26 for connection with LSI devices are formed on the LSI mounting surface of the interposer substrate 20. Pad electrodes 24 for bonding to the printed circuit board (not illustrated in the figures) and a metal frame 25 for sealing the evaporator case 11 are formed on the opposite side to the LSI mounting surface.

Although illustration is omitted in FIG. 9A, the LSI devices 2a and 2b are electrically connected to the interposer substrate 20 via the pad electrodes, as illustrated in FIG. 8C. Similarly, the interposer substrate 20 on which the LSI devices 2a and 2b are mounted is mounted on the printed circuit board 40, as illustrated in FIG. 8D. The groove structure 50 may be fixed to the interposer substrate 20 before the interposer substrate 20 is mounted on the printed circuit board 40 (in the step corresponding to FIG. 8C). Alternatively, the groove structure 50 may be fixed to the interposer substrate 20 after the interposer substrate 20 is mounted on the printed circuit board 40 (in the step corresponding to FIG. 8D).

The groove structure 50 is fabricated by, for example, an electroforming process, into a desired shape. In this example, a groove structure 50 having grooves with an aspect ratio between 20 to 30 may be created using Cu electroplating, Ni electroplating, or the like. The groove structure 50 may also be formed using Al or other materials. In the example of FIG. 9A, the depth of the groove is selected between 0.5 mm to 1 mm and the spacing between grooves is selected between 30 to 500 μm. The groove structure 50 may includes a first groove structure 53a and a second groove structure 53b. The first groove structure 53a has grooves 51a and the partition walls 52a. The second groove structure 53b has grooves 51b and the partition walls 52b, the aspect ratio of which is different from that of the first groove structure 53a. This arrangement can cool multiple LSI devices having different heat generating levels in an efficient manner.

The groove structure 50 is bonded to the surface (in the recess 28 if provided) opposite to the LSI mounting surface of the interposer substrate 20 using, for example, an indium sheet. Using Indium sheet is advantageous to reduce the surface roughness and enhance the thermal conduction.

The evaporator case 11 is held in tight contact and sealed against the interposer substrate 20 such that the partition walls 52a and 52b of the groove structure 50 come into contact with the porous wick 15. The end periphery 11a of the evaporator case 11 is soldered to the metal frame 25 by a low-temperature soldering process. The porous wick 15 is, for example, a polyethylene porous material with average pore size of 10 μm and porosity of 40%. After the sealing, hydrochlorofluorocarbon is introduced in the loop (not illustrated in figures) and a semiconductor package 81 illustrated in FIG. 9B is completed.

By using a separately formed groove structure 50 in the semiconductor package 81, the cross-sectional area of the flow channel in the grooves 51a and 51b can be adjusted freely in the height direction. By increasing the cross-sectional area in the height direction, uniformity and efficiency in heat absorption is further improved.

[Embodiment 2]

Figure 10:
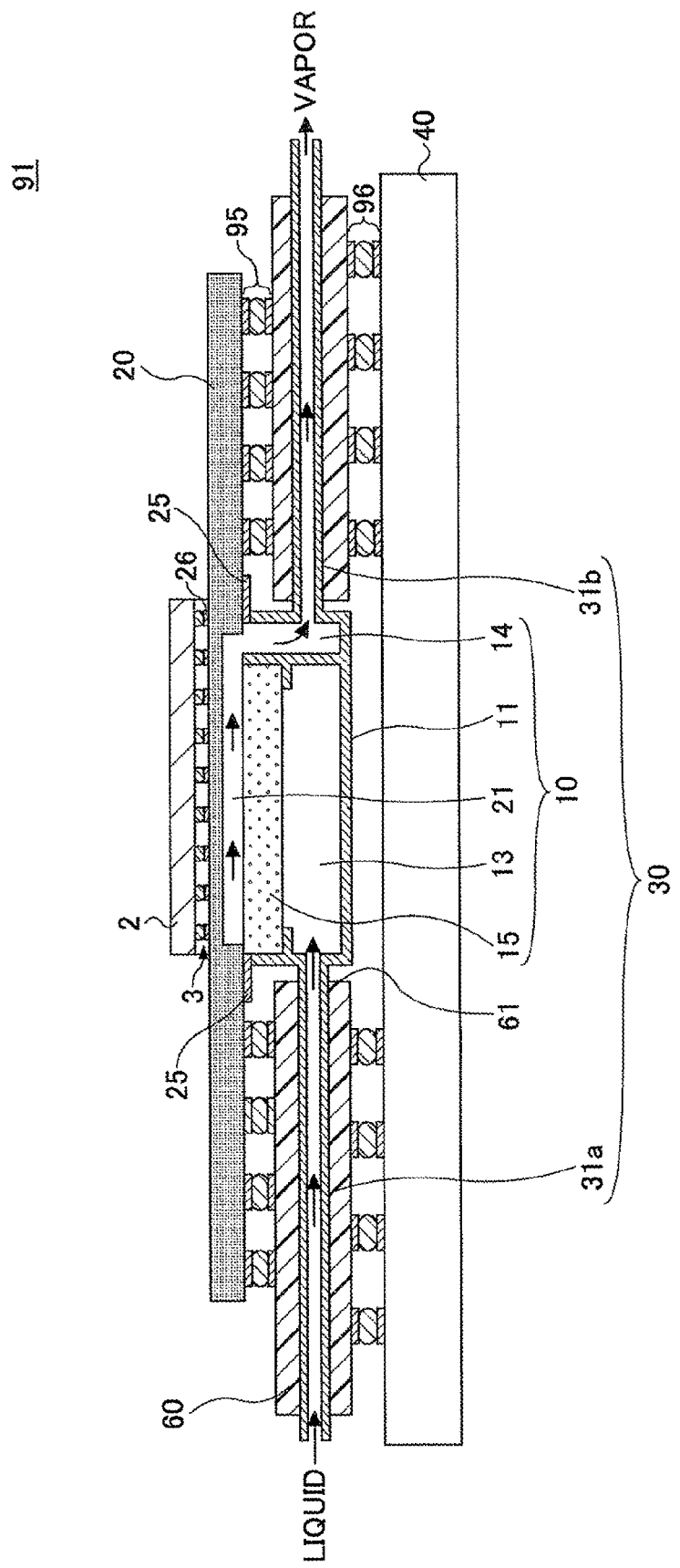
FIG. 10 is a schematic cross-sectional view of a semiconductor package in which a loop heat pipe is assembled according to the second embodiment.

FIG. 10 is a schematic cross-sectional view of a semiconductor package 91 according to Embodiment 2 of the present disclosure. In the semiconductor package 91, a thermal interposer substrate 60 is inserted between the interposer substrate 20 and the printed circuit board 40. The thermal interposer substrate 50 has a built-in liquid line 31a and a built-in vapor line 31b, which lines are a part of the loop heat pipe 30.

The interposer substrate 20 on which an LSI device 2 is mounted is electrically connected to the thermal interposer substrate 60 via a connection part 95. The thermal interposer substrate 60 is electrically connected to the printed circuit board 40 via a bonding part 96. An electrical signal such as a power supply signal is transmitted to the printed circuit board 40 from the interposer substrate 20.

An opening 61 is formed on the thermal interposer substrate 60 in advance, and the evaporator 10 of the loop heat pipe 30 is placed in the opening 61. The evaporator 10 has a fluid chamber 13 that contains liquid phase working fluid supplied from the liquid line 31a. A porous wick 15 is arranged top of the fluid chamber (so as to be adjacent to the interposer substrate 20). A groove structure (see FIG. 3) with grooves 21 is provided in the interposer substrate 20. Although not illustrated in the figure, the partition walls of the groove structure are in contact with the porous wick 15 as in Embodiment 1

The thermal interposer substrate 60 has a structure in which two glass epoxy substrates are bonded together and sandwiched by one or more wiring layers. The glass epoxy substrates are provided with grooves in advance to hold the liquid line 31a and the vapor line 31b. After the bonding and the sandwiching of the glass epoxy substrates, the opening 61 is cut out together. Although not illustrated in the figure, through via plugs penetrating through the substrate and interlayer via plugs are formed in the thermal interposer substrate 60 in the area other than the pathway of the liquid line 31a and the vapor line 31b. In addition to the grooves for receiving the liquid line 31a and the vapor line 31b, channels for letting the coolant flow through may be formed in advance.

To seal the evaporator case 11, the upper end of the evaporator case 11 is soldered to the metal frame 25 when mounting the interposer substrate 20, on which the LSI device 2 is disposed, onto the thermal interposer substrate 60 via the bonding part 95. Then, the thermal interposer substrate 60 in which the loop heat pipe 30 including the evaporator 10 is built is mounted on the printed circuit board 40 to complete the semiconductor package 91. The semiconductor package 91 of Embodiment 2 allows electronic components including capacitors to be arranged on the thermal interposer substrate 60, and design flexibility is improved.

As has been explained above, the heat absorption path for the LSI device is configured by transferring heat from the solder bumps via the partition walls of the groove structure of the interposer substrate to the porous wick, absorbing heat making use of evaporative latent heat, and discharging the vapor containing heat through the grooves of the groove structure. By incorporating the selective groove structure of the interposer substrate into the evaporator, heat from the LSI device is transferred directly to the porous wick without using a thermal conductive material. Consequently, heat absorption from LSI devices is carried out efficiently.

The groove structure may employ an arbitrary layout and shape according to the amount of heat generated by the LSI devices. The temperature distribution in the package substrate becomes uniform. For a multi-chip package with multiple LSI devices mounted, temperature variation among chips is reduced, and besides localized hot spots can be eliminated in individual chips. The efficiency of heat absorption becomes uniform.

The semiconductor packages according to the embodiments may be combined with a conventional heat sink. In this case, heat is removed more effectively from the connection part of the chip, while making efficient use of heat sink ability.

The embodiments have been described above on the basis of exemplified and unlimited examples. There are many modifications and improvements that can be made by a person with an ordinary skill in the art. For example, the interposer substrate is not limited to a silicon substrate and a glass substrate may be used. The thermal interposer substrate is not limited to a resin such as glass epoxy, and a metal-core substrate may be used. In the latter case, grooves working as a liquid line and a vapor line or an optional channel for allowing a coolant flow may be formed in the core metal.

The techniques of the embodiments are applicable to a cooling process for cooling a heat source, and especially cooling an electronic device in which an electronic component is packaged.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

The invention claimed is:

1. A semiconductor package comprising:
    a substrate with a first surface on which at least one semiconductor device is mounted and a second surface opposite to the first surface;
    a loop heat pipe including an evaporator and attached to the second surface of the substrate; and
    a board configured to mount the substrate,
    wherein the substrate has a groove structure in the second surface, the groove structure being in contact with a porous wick provided in the evaporator, and
    wherein the board has an opening in which the evaporator is accommodated.

2. The semiconductor package according to claim 1, wherein the groove structure is a part of a fluid channel of the loop heat pipe.

3. The semiconductor package according to claim 1, wherein the groove structure has multiple areas, each of the multiple areas having different groove widths and/or different groove spacing.

4. The semiconductor package according to claim 3,
    wherein two or more of the at least one semiconductor device are mounted on the substrate, and each of the multiple areas of the groove structure has the different groove widths and/or the different groove spacing according to a quantity of heat generated by a respective one of two or more of the at least one semiconductor device.

5. The semiconductor package according to claim 1, wherein the groove structure is formed directly in the substrate.

6. The semiconductor package according to claim 1, wherein the groove structure is formed of a different material from the substrate.

7. The semiconductor package according to claim 6, wherein the groove structure has a respective partition wall separating adjacent grooves, and a height of the respective partition wall of the groove structure is greater than a thickness of the substrate.

8. The semiconductor package according to claim 1, wherein the board is a printed circuit board.

9. The semiconductor package according to claim 1, wherein the board is a thermal interposer substrate inserted between the substrate and a printed circuit board.

10. The semiconductor package according to claim 9, wherein a part of a fluid channel of the loop heat pipe is incorporated in the thermal interposer substrate.

11. The semiconductor package according to claim 1, wherein the evaporator has an evaporator case, and the evaporator case is soldered to the substrate so as to keep the porous wick in contact with the groove structure.

12. The semiconductor package according to claim 11, wherein a melting point of a first solder material used to solder the evaporator case to the substrate is lower than a melting point of a second solder material used to mount the at least one semiconductor device on the substrate.

13. A cooling mechanism comprising:
    a groove structure provided on a surface opposite to an electronic-component mounting surface of a substrate, the groove structure having grooves and a respective partition wall separating adjacent grooves of the grooves;
    a porous wick arranged in contact with the respective partition wall of the groove structure;
    an evaporator case configured to accommodate the porous wick and held in tight contact against the substrate, while keeping the porous wick in contact with the respective partition wall of the groove structure; and
    a fluid circulating channel connected in a loop to the evaporator case; and
    a board configured to mount the substrate,
    wherein the groove structure of the substrate is a part of the fluid circulating channel, and
    wherein the board has an opening in which the evaporator case is accommodated.

14. A method for manufacturing a semiconductor package, comprising:
    providing at least one groove structure to a surface opposite to a device mounting surface of a substrate on which at least one semiconductor device is mounted;
    attaching an evaporator of a loop heat pipe to the substrate such that a porous wick provided inside the evaporator is in contact with the at least one groove structure; and
    electrically connecting the substrate to a board having an opening at a prescribed position so as to arrange the evaporator in the opening.

15. The method according to claim 14, wherein providing the at least one groove structure includes forming multiple grooves directly in the substrate.

16. The method according to claim 14, wherein providing the at least one groove structure includes bonding a separately fabricated groove structure onto the surface opposite to the device mounting surface of the substrate.

17. The method according to claim 14, wherein a temperature for bonding the evaporator to the substrate is lower than a temperature for mounting the at least one semiconductor device on the substrate.

18. The method according to claim 14, further comprising:
    forming two or more of the at least one groove structure, each of two or more of the at least one groove structure having different groove widths and/or different groove intervals than others of the two or more of the at least one groove structure, the at least one groove structure formed directly in the surface opposite to the device mounting surface of the substrate; and mounting two or more of the at least one semiconductor device on the device mounting surface of the substrate at positions corresponding to said two or more of at least one groove structure.

* * * * *